United States Patent
Zhang et al.

(10) Patent No.: US 11,567,520 B2
(45) Date of Patent: Jan. 31, 2023

(54) EXPONENTIAL-BASED SLOPE COMPENSATION

(71) Applicant: Texas Instruments Incorporated, Dallas, TX (US)

(72) Inventors: Weicheng Zhang, Shanghai (CN); Jian Liang, Shanghai (CN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 12 days.

(21) Appl. No.: 17/231,176

(22) Filed: Apr. 15, 2021

(65) Prior Publication Data
US 2022/0326724 A1    Oct. 13, 2022

Related U.S. Application Data

(60) Provisional application No. 63/171,725, filed on Apr. 7, 2021.

(51) Int. Cl.
*G05F 1/567* (2006.01)
*H03K 5/24* (2006.01)

(52) U.S. Cl.
CPC .............. *G05F 1/567* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 6,522,115 B1* | 2/2003 | Greitschus | G05F 1/613 323/283 |
| 7,126,318 B2 | 10/2006 | Oswald et al. | |
| 7,589,509 B2* | 9/2009 | Nishida | H03K 4/502 323/283 |
| 8,004,253 B2 | 8/2011 | Beltran | |

(Continued)

FOREIGN PATENT DOCUMENTS

CN    104092374 B    2/2017

OTHER PUBLICATIONS

Sakurai, Hiroki et al. "Design of a Current-mode, MOS, DC-DC Buck Converter with a Quadratic Slope Compensation Scheme." 2005 IEEE.

(Continued)

*Primary Examiner* — Jeffery S Zweizig
(74) *Attorney, Agent, or Firm* — Ray A. King; Frank D. Cimino

(57) ABSTRACT

A voltage converter includes an inductor, a transistor, a comparator, an error amplifier, and a slope generator circuit. The transistor has a control input and first and second transistor current terminals. The first current terminal is coupled to the inductor. The comparator has first and second comparator inputs and a comparator output. The comparator output is usable to control the transistor's control input. The error amplifier has an error amplifier input and an error amplifier output. The error amplifier output is coupled to the first comparator input. The slope generator circuit is coupled to at least one of the first or second comparator inputs. The slope generator circuit is configured to generate a slope compensation current which, during at least a portion of each cycle of operation of the voltage regulator, varies approximately exponentially with respect to time.

19 Claims, 9 Drawing Sheets

(56) References Cited

U.S. PATENT DOCUMENTS

| | | | |
|---|---|---|---|
| 8,138,740 B2* | 3/2012 | Yuan | G05F 1/10 323/288 |
| 8,354,798 B2* | 1/2013 | Redjebian | H05B 41/34 315/120 |
| 11,081,958 B2* | 8/2021 | Liang | H02M 3/156 |

OTHER PUBLICATIONS

Wu, H. et al. "Polynomial Curve Slope Compensation for Peak Current Mode Controlled Power Converters." IEEE Transactions on Industrial Electronics 2018. DOI: 10.1109/TIE.2018.2826451. 12 pgs.

Texas Instruments. "Practical Feedback Loop Analysis for Current-Mode Boost Converter." Application Report SLVA636—Mar. 2014. pp. 1-12.

\* cited by examiner

EXPONENTIAL-BASED SLOPE COMPENSATION

CROSS-REFERENCE TO RELATED APPLICATION

This application claims priority to U.S. Provisional Application No. 63/171,725, filed Apr. 7, 2021, which is hereby incorporated by reference.

BACKGROUND

Voltage regulators generate an output voltage at a prescribed level based on an input voltage. One type of voltage regulator is a switching regulator in which solid-state Switches (e.g. metal oxide semiconductor field effect transistors) are turned on and off. The switches may be coupled to an inductor. When one of the switches is turned on, current through the inductor increases, and when that switch is turned off and another switch is turned on, the inductor current decreases. Switching regulators can be implemented as buck converters, boost converters, etc.

The switching frequency may be fixed or variable. Further, the duty cycle associated with the control of the switch(es) may be fixed or variable. One type of control technique for switching regulators is current mode control in which a dock is used to turn on a first switch, and the inductor current reaching a threshold signal (either peak or valley threshold) causes the control logic to turn off the first switch and turn on a second switch.

For switching regulators that implement fixed frequency switching and current mode control, the peak or valley threshold signal should be slope compensated when the duty cycle exceeds 50%, otherwise the switching regulator may be unstable. At duty cycles less than 50%, slope compensation is generally not needed.

SUMMARY

In accordance with at least one example, a voltage converter includes an inductor, a transistor, a comparator, an error amplifier, and a slope generator circuit. The transistor has a control input and first and second transistor current terminals. The first current terminal is coupled to the inductor. The comparator has first and second comparator inputs and a comparator output. The comparator output is usable to control the transistor's control input. The error amplifier has an error amplifier input and an error amplifier output. The error amplifier output is coupled to the first comparator input. The slope generator circuit is coupled to at least one of the first or second comparator inputs. The slope generator circuit is configured to generate a slope compensation current which, during at least a portion of each cycle of operation of the voltage regulator, varies approximately exponentially with respect to time.

DETAILED DESCRIPTION

Figure 1:
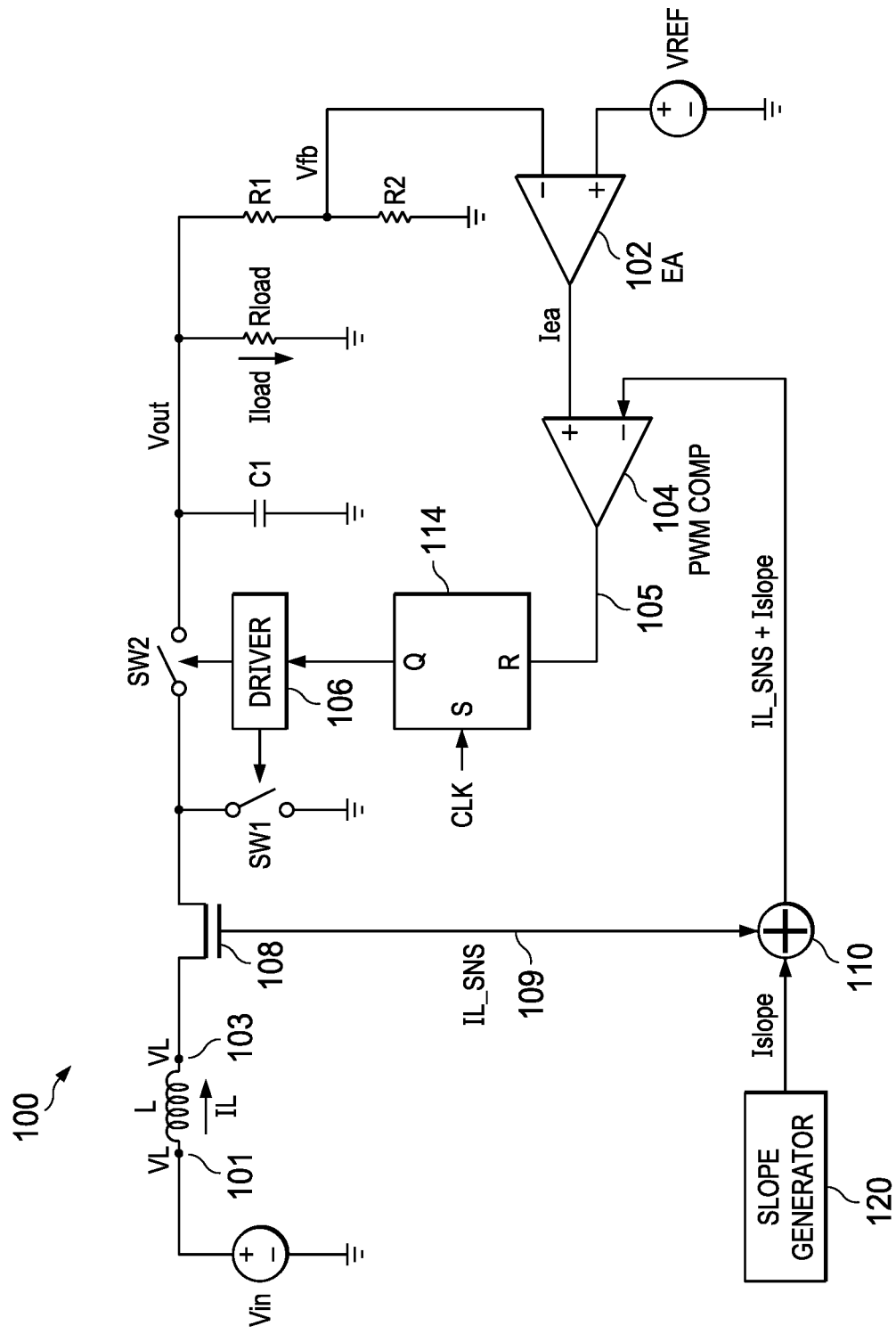
FIG. 1 illustrates a boost converter that includes a slope compensation circuit in accordance with an example.

Types of switching regulators include boost converters, buck converters, buck-boost converters, single-ended primary-inductor converters (SEPICs), etc. FIG. 1 shows an example of a boost converter 100. Boost converter 100 in the example of FIG. 1 includes an inductor L, switches SW1 and SW2, a capacitor C1, resistors R1 and R2, an error amplifier 102, a comparator 104, a driver 106, a set-reset (SR) latch 114, and a slope generator circuit 120. Resistors R1 and R2 are connected in series between the output (VOUT) of the boost converter 100 and ground, and thus comprise a voltage divider to generate a feedback voltage Vfb that is proportional to VOUT (Vfb=VOUT*R2/(R1+R2)). Resistance Rload represents the resistance of a load connected to VOUT and that is powered by VOUT. Current ILOAD is the load current through the load.

The error amplifier 102 has a negative input (−) and a positive input (+). The negative input is coupled to resistor R2 and receives Vfb. A reference voltage VFEF is provided to the positive input. The output of the error amplifier 102 provides an output signal, Iea, whose magnitude is proportional to the difference between Vfb and VREF (Iea= (VREF−Vfb)*GAIN, where GAIN is the gain of the error amplifier). The output signal Iea may be a current in one embodiment, or a voltage in another embodiment.

The comparator 104 includes a positive input and a negative input. In the example of FIG. 1, the output of the error amplifier 102 is coupled to the comparator's positive input. The boost converter 100 generates a signal 109 that is equal or proportional to the current through the inductor (IL). Reference numeral 108 refers to a current sense element that senses the inductor current IL. In one example, the current sense element 108 is a sense transistor connected in parallel with switch SW1, which also is a transistor. Signal 109 is designated IL_SNS and is added, via a summing device or summing junction 110 to a slope current, Islope, generated by the slope generator circuit 120 to thereby produce a signal labeled as IL_SNS+Islope. The comparator 104 compares Iea to IL_SNS+Islope to generate an output signal 105 to the driver 106. Output signal 105 is logic high when Iea is larger than IL_SNS+Islope, and logic low when Iea is smaller than IL_SNS+Islope.

In one example, switches SW1 and SW2 are implemented as metal oxide semiconductor field effect transistors (MOS transistors). MOS transistors have a control input (a gate) and a pair of current terminals (source and drain). The driver 106 generates suitably sized gate voltages to control the on and off state of switches SW1 and SW2 in response to an output signal from the Q output of SR latch 114. The set (S) input of SR latch 114 receives a clock signal (CLK) and the reset (R) input of SR latch 114 is coupled to the output signal 105 from the comparator 104. When the S input is asserted high, the Q output becomes high, and when the R input is asserted high (by the output of comparator 104), the Q output is low. The boost converter 100 in the example of FIG. 1 operates at a fixed frequency (e.g., 250 KHz), that is, the clock signal CLK has a fixed frequency and is used to control the switching period of the converter. A fixed frequency clock has fixed time duration period. During each cycle of the clock, the driver 106 first turns on switch SW1 and turns off switch SW2. For example, each rising edge of the clock causes the driver to turn on switch SW1 and turn off switch SW2.

When switch SW1 is on (and switch S2 is off), inductor current IL linearly increases, and energy is stored in the inductor's magnetic field. The voltage polarity of the inductor L (VL) is such that the terminal 101 of the inductor connected to VIN will be positive with respect to the opposing inductor terminal 103.

When switch SW1 is turned off (and switch SW2 is turned on), the magnetic field created by the inductor when switch SW1 was on is reduced in energy to maintain the inductor current IL flowing towards the load (Rload). The voltage polarity across the inductor L reverses (the voltage polarity of VL is such that the terminal 101 of the inductor connected to VIN will be negative with respect to the opposing inductor terminal 103). In this state (SW2 on and SW1 off), VOUT will be equal to the sum of VIN and the voltage across the inductor, and thus VOUT will be higher than VIN. A higher voltage (VIN+VL) charges capacitor C1. Accordingly, when switch SW1 is on, inductor current IL increases. When switch SW2 is then turned on (and SW1 is turned off), the only path offered to the inductor current IL is through switch SW2 to the capacitor C1 and load Rload. As such, energy accumulated in the inductor in the first phase (SW1 on, SW2 off) is transferred to the capacitor C1 in the second phase (SW1 off, SW2 on).

The boost converter 100 of FIG. 1 implements current mode control. For one type of current mode control, switch SW1 is turned on (SW2 off) by the clock, but is turned off (and SW2 is turned on) responsive to the sensed inductor current, IL_SNS, reaching a threshold value. In this example, the threshold value is a "peak command" meaning that, during that portion of each cycle when switch SW1 on and inductor IL linearly increases, the inductor current IL (or its sensed version, IL_SNS) reaching the peak command causes switch SW1 to be turned off and switch SW2 to be turned on.

Another type of current mode control is valley command-based current mode control in which the threshold value to which the inductor current IL (or its sensed version IL_SNS) is compared is a "valley command." For valley command-based current mode control, during that portion of each cycle when switch SW2 on and inductor IL decreases, the inductor current IL (or its sensed version, IL_SNS) falling to the valley command causes switch SW2 to be turned off and switch SW1 to be turned on. In this mode, the clock causes the switch SW2 to be turned.

Figure 2:
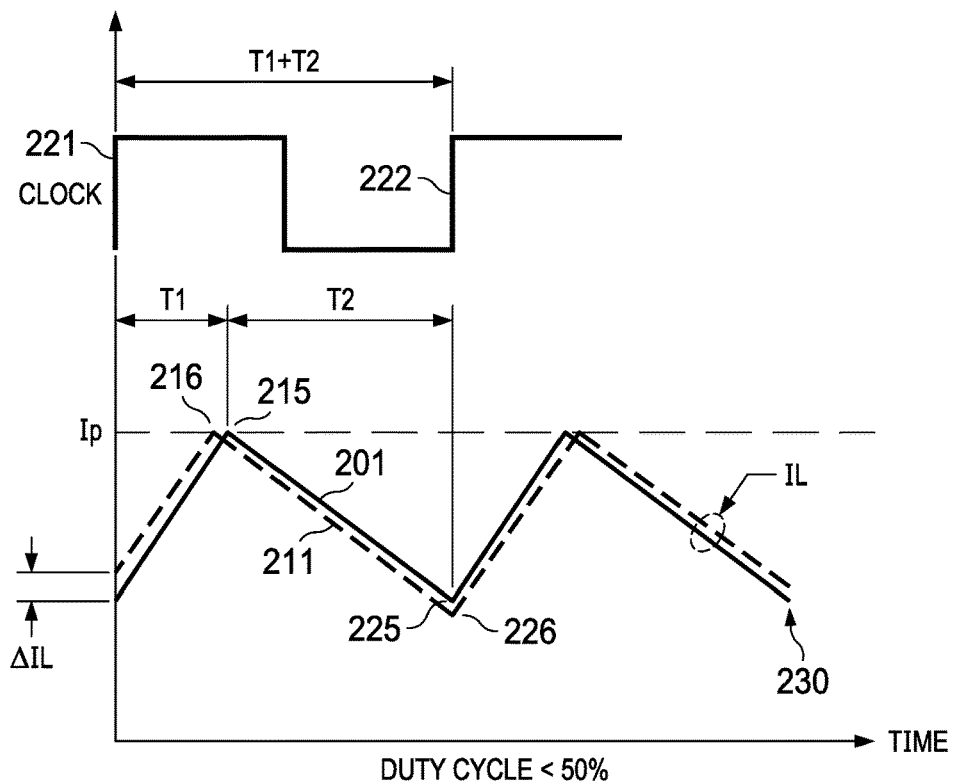
FIG. 2 illustrates peak current mode control with a fixed level peak command.

FIG. 2 shows an example of peak command-based current mode control in which the inductor current is compared to a peak command, Ip. In this and all other explanations herein, any reference to comparing the inductor current to a threshold refers to comparing the sensed inductor current, IL_SNS, to a threshold. A clock signal (CLOCK) is shown as well. Rising edges 221 and 222 are identified for the CLOCK signal. Two waveforms 201 (solid line) and 211 (dashed line) are shown for the inductor current for two switching cycles. Waveform 201 represents a nominal inductor. When rising edge 221 of CLOCK occurs, switch SW1 is turned on and switch SW2 is turned off, and the inductor current of waveform 201 increases as shown. When inductor IL of waveform 201 reaches the peak command Ip (indicated by reference numeral 215), switch SW1 is turned off and switch SW2 is turned on. At that point, inductor current (waveform 201) decreases. The next rising edge 222 of CLOCK then causes switch SW1 to be turned back on (SW2 off) and the inductor current of waveform 201 again increases as shown.

In FIG. 2, the on-period of switch SW1 is T1 and the off-period of switch SW1 is T2. The length of each period of the CLOCK signal is T1+T2. The duty cycle for switch SW1 (e.g., the ratio of its on-time, T1, to the period, T1+T2) is less than 50% in the example of FIG. 2. Because the switching frequency is fixed in this example, different target levels of VOUT can be generated by varying the duty cycle—smaller duty cycles lead to smaller levels of VOUT and larger duty cycles lead to larger levels of VOUT.

For FIG. 2, inductor current waveform 211 includes a disturbance which may occur, for example, due to a step increase in VIN. The disturbance is shown initially as inductor current in waveform 211 being slightly higher (ΔIL) at clock rising edge 221 than the inductor current in waveform 201. Because the inductor current in waveform 211 starts out at a slightly higher level than the inductor current in waveform 201, the inductor current in waveform 211 reaches the peak command Ip earlier, as indicated at 216. As a result, the on-time for switch SW1 for waveform 211 is shorter and the off-time is longer. The inductor current for waveform 211 falls to a smaller level (identified at 226) than was the case for the inductor current of waveform 201 (identified at 225).

On the next switching cycle (initiated by rising edge 222 of the CLOCK signal), the inductor current of waveform 211 starts at a lower level than during the previous switching cycle, so the inductor current takes longer to reach the peak current command, Ip. During this second switching cycle, the on-time for switch SW1 for waveform 211 is longer and the off-time is smaller, and thus the duty cycle is slightly larger than was the case for the previous switching cycle. At the end of the second switching cycle (identified at 230), the inductor current of waveform 211 is higher than the nominal inductor current of waveform 201, but only by a small amount (smaller than ΔIL). At the end of the next switching cycle (not shown), the difference in the inductor current between waveforms 201 and 211 would be even smaller (perhaps negligible) and thus the converter is stable.

Figure 3:
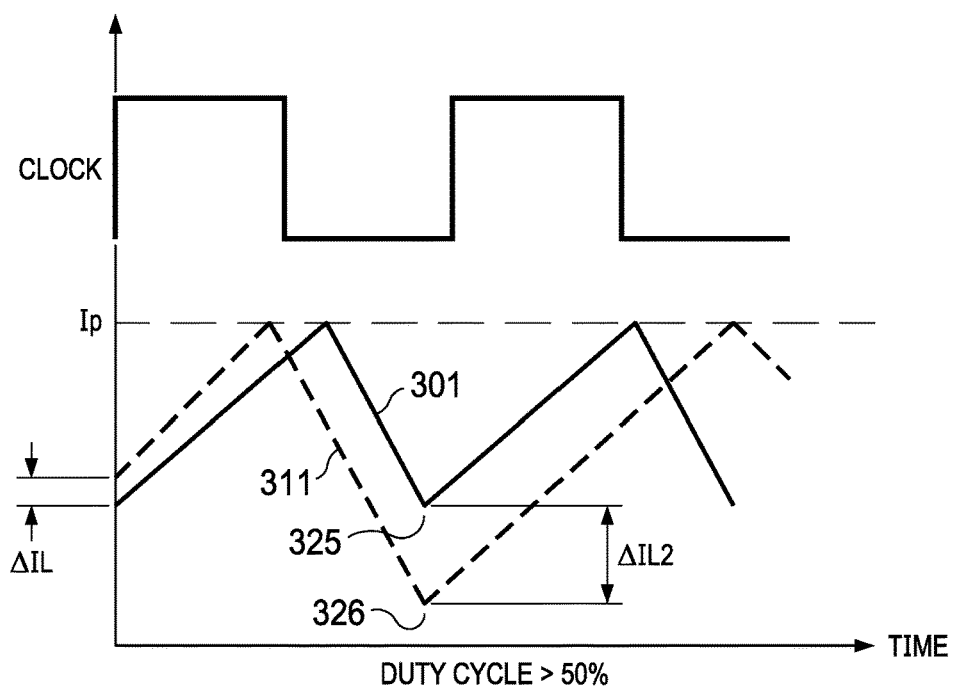
FIG. 3 illustrates the potential for the converter to operate in an unstable state if a fixed level peak command is used without slope compensation.

FIG. 3 is similar to FIG. 2 but for a duty cycle that is greater than 50%. Inductor current waveform 301 is a nominal waveform and inductor current waveform 311 starts with a small increase as was explained above with regard to FIG. 2. As before, the peak current command Ip is reached earlier in waveform 311 than for waveform 301. Because the switching frequency is fixed, the off-time of switch SW1 is increased significantly and thus the inductor current of waveform 311 falls to a significantly lower level at 326 than was the case at 325 for the nominal inductor current of waveform 301.

Thus, the second switching cycle begins with the inductor current of waveform 311 starting at a much lower level compared to waveform 301 (ΔIL2) than was the case for current delta at the beginning of the first switching cycle (ΔIL). The peak current command Ip is not reached for the inductor current of waveform 311 during the second cycle of waveform 301. Accordingly, the on-time of switch SW1 will alternate between long and short periods, causing the converter to operate at half the nominal switching frequency—a condition sometimes referred to as subharmonic oscillation. The ripple current of the converter will alternate between low and high levels.

Figure 4:
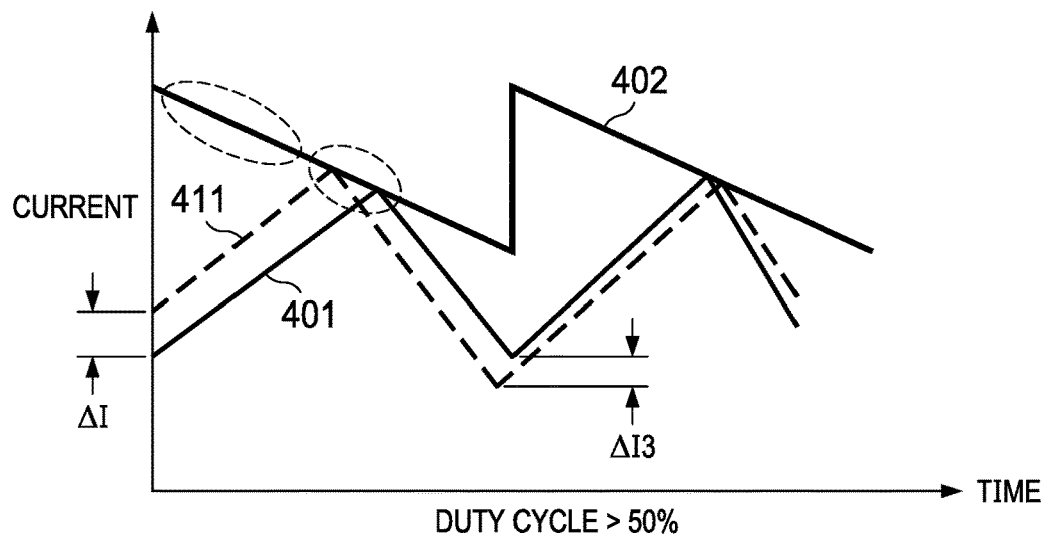
FIG. 4 illustrates the use of linear slope compensation with accordance with an example.

Subharmonic oscillation, which may occur for switching regulators that (a) operate at a fixed frequency, (b) employ current mode control and (c) operate at duty cycles greater than 50% can be avoided or at least mitigated through use of slope compensation. FIG. 4 illustrates the benefit of slope compensation. Like FIG. 3, the duty cycle of FIG. 4 also is greater than 50%. However, in FIG. 4 rather than comparing the inductor current IL to a fixed peak command, Ip, the peak command is slope compensated. That is, a cyclical ramp-based current (Islope) is added to the fixed peak command to produce a slope-compensated peak command signal 402 to which the inductor current is compared. Waveform 401 represents a nominal inductor current, and waveform 411 represents an inductor current that has been slightly varied from the nominal inductor at the beginning of the first switching cycle. Because the slope-compensated peak command signal 402 has a slope to it as shown, the inductor current of waveform 411 is permitted to reach a higher level than would have been the case if only a constant peak current command, Ip, had been used. Consequently, the inductor current of waveform 411 does not drop as far as was the case for waveform 311 by the time that the next switching cycle starts (ΔIL3 is smaller than ΔIL2). Further, over several switching cycles, the difference between waveforms 411 and 401 decreases, and thus a switching converter that employs slope compensation is stable.

It can be shown that the slope of Islope, to which the inductor current IL is added, should have a slope that is a function of duty cycle (D)—the larger the duty cycle, the larger the slope. Using a linear ramp-based Islope signal for slope compensation presents three challenges. First, the loop transient response of the converter may be excessively slow. The loop transient response is how fast the converter re-achieves steady state operation as a result of a sudden change in VIN or load current (current to the load, Rload). That the loop transient response may be excessively slow result from the fact that Islope may need to be much larger than the sensed inductor current. Therefore, once a load transient or VIN transient happens, to adjust the inductor current IL, the output of the error amplifier 102 has to change a significant amount to take effect, which may take considerable time. Second, because Islope ramps down as shown in FIG. 4 (or ramps up in the case of valley mode current control) and thus starts (or stops) at a relatively high value, Islope requires the error amplifier 102 and/or comparator 104 to have significant headroom. Third, typically the error amplifier output current is limited to a maximum value which causes the current limited value to have a dependency on duty cycle.

Figure 5A:
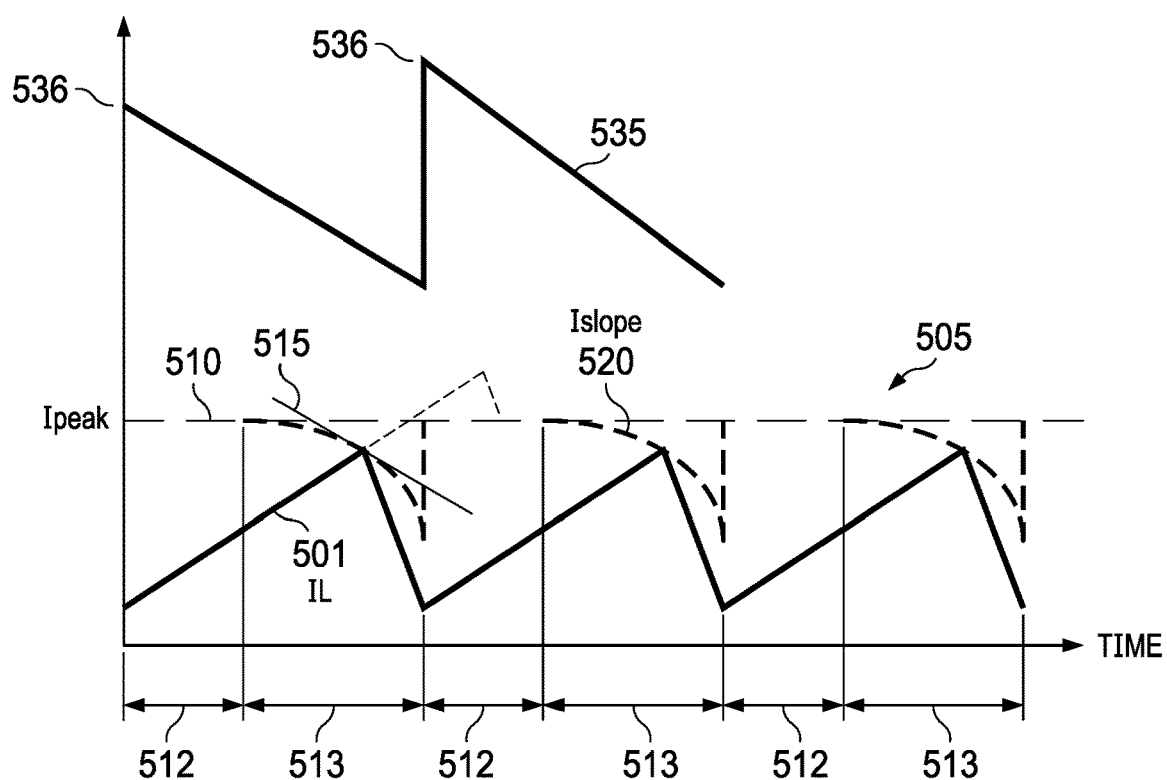
FIG. 5A illustrates the use of exponential slope compensation for peak current mode control in accordance with an example.

FIG. 5A shows an example in which exponential slope compensation is employed, rather than ramp-based slope compensation as in FIG. 4. FIG. 5A illustrates a slope compensation signal 505 that, for at least a portion of its switching cycle, is exponential with respect to time. The slope compensation signal 505 is approximately flat (approximately zero slope) for a first portion 512 of each switching cycle. During a second portion 513, the slope compensation signal 505 has a dynamically changing slope, e.g. an exponentially changing slope. The slope of the slope compensation signal 505 at the time that the inductor current 501 is equal to the slope compensation signal is shown as slope line 515. For a linearly ramping slope compensation signal, as illustrated in FIG. 4, it can be shown that the slope should be larger than a minimum value that is a function of the duty cycle (D) at which the converter operates in order to maintain the converter operating in a stable state. For example, the slope of a linearly ramping slope compensation signal is a function of $1/(1-D)$. As D increases, the slope of the slope compensation signal should increase.

The slope of the exponentially increasing slope compensation signal 505 in FIG. 5A is small at the beginning of each switching cycle portion 513 but increases during each portion. An example linear ramping slope compensation signal 535 is shown in FIG. 5A for comparison with the exponential slope compensation signal 505. By the time the inductor current 501 reaches the slope compensation signal 505, the slope of the slope compensation signal 505 (illustrated by slope line 515) is approximately equal to the slope of comparison linear ramping slope compensation signal 535, which has a suitable slope for the given duty cycle. As FIG. 5A shows, the maximum magnitude of the exponential slope compensation signal 515 (during portion 512) is substantially smaller than the maximum magnitude of the linear ramping slope compensation signal 535 (which occurs at the beginning 536 of each switching cycle).

Figure 5B:
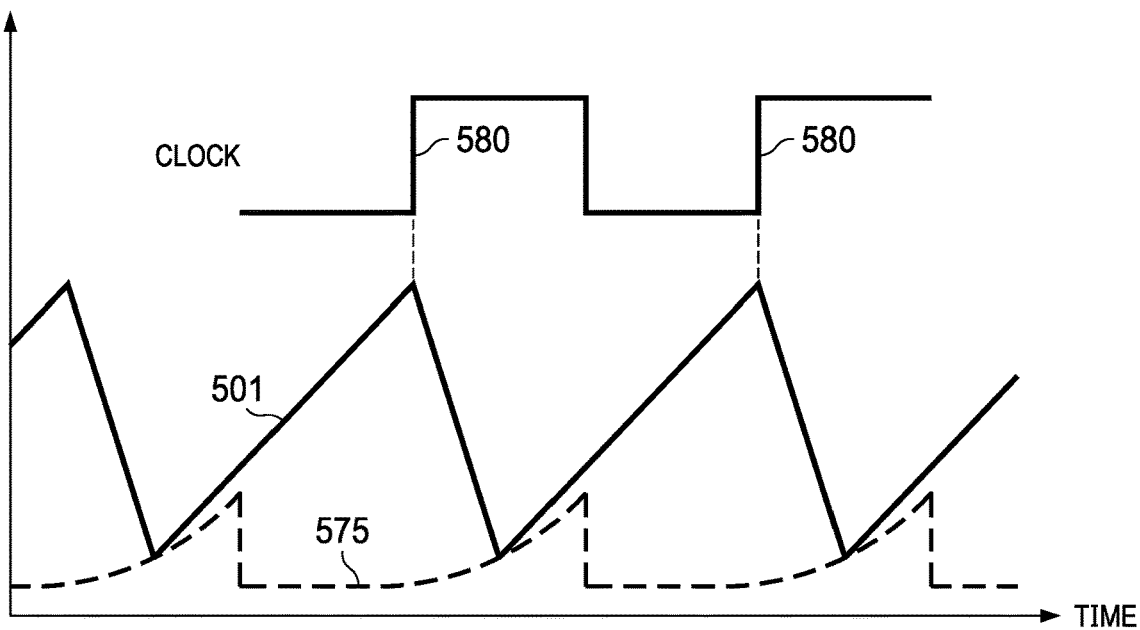
FIG. 5B illustrates the use of exponential slope compensation for valley current mode control in accordance with an example.

FIG. 5B shows another example of an exponential slope compensation signal 575 that exponentially increases during each switching cycle instead of exponentially decreasing as in FIG. 5A. The exponential slope compensation signal 575 is suitable for implementing valley mode current control in which the linearly falling inductor current 501 is compared to the exponential slope compensation signal 575. Rising edges 580 of a clock (CLOCK) causes the switch SW1 to be turned off and switch SW2 to be turned on, at which time the inductor current 501 drops linearly. When the inductor current 501 reaches the exponential slope compensation signal 575, switch SW1 is caused to be turned on and switch SW2 is turned off, and the inductor current increases.

Exponential slope compensation can be employed for a boost converter as in FIG. 1. Exponential slope compensation can also be employed for other types of switching converters such as buck converters.

Figure 6:
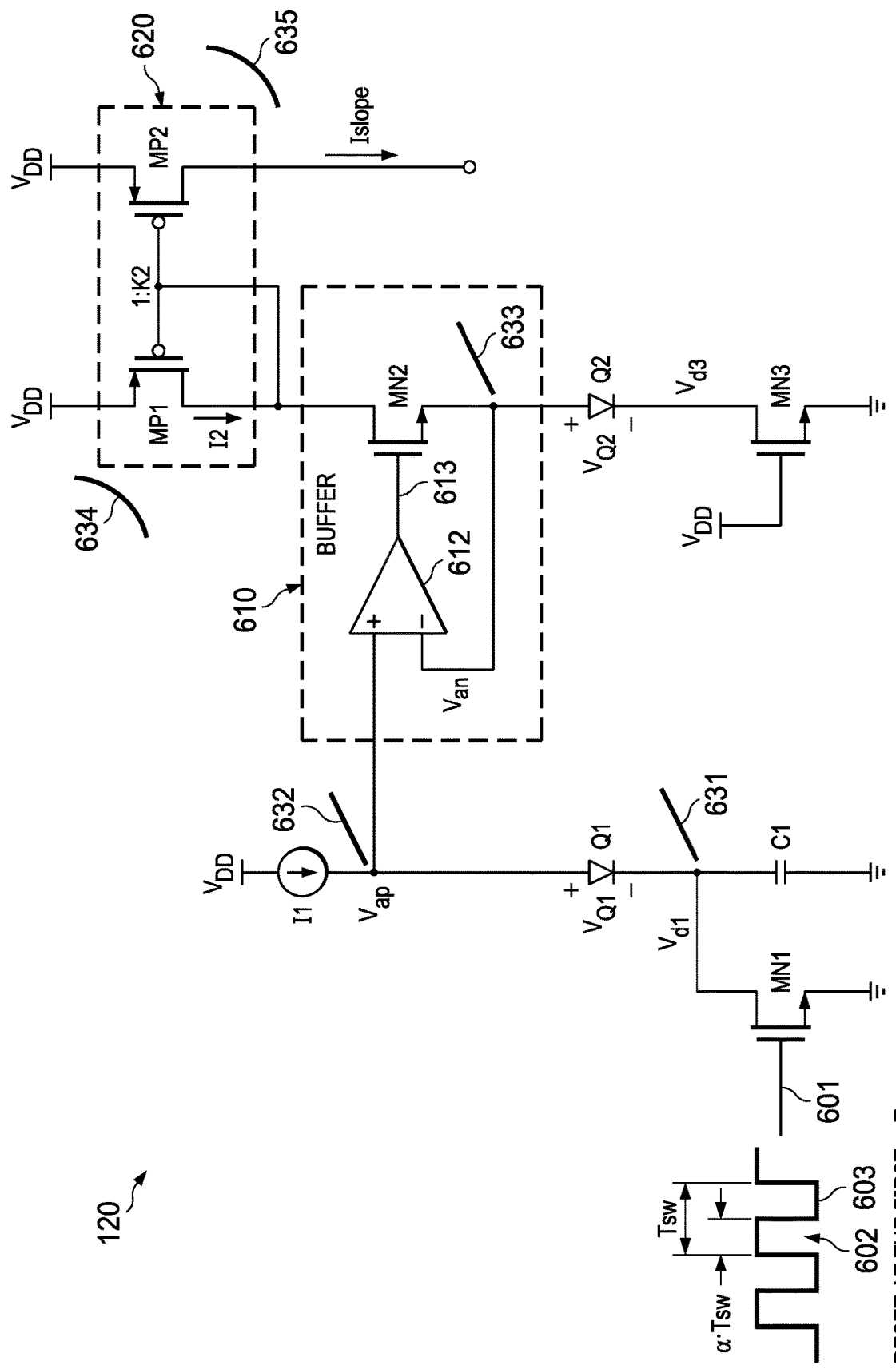
FIG. 6 shows an implementation of the slope compensation circuit of FIG. 1 in which exponential slope compensation is implemented for valley current mode control in accordance with an example.

FIG. 6 shows an example of the slope generator circuit 120. The example slope generator circuit 120 includes transistors MN1 and MN3, a capacitor C1, diodes Q1 and Q2, buffer 620, a current source circuit I1 ("I1" refers to both the current source circuit and the current produced therefrom), and a current mirror 620. Diodes Q1 and Q2 may be implemented as diodes or as diode-connected transistors. Buffer 610, in this example, includes an operational amplifier 612 and a transistor MN2. Transistors MN1-MN3 are N-type metal oxide semiconductor field effect transistors (NMOS transistors). Current mirror 620 includes transistors MP1 and MP2. Transistors MP1 and MP2 are N-type metal oxide semiconductor field effect transistors (PMOS transistors). Each or all of transistors MN1-MN3 and MP1-MP2 can be implemented as other types of transistors, for example, NMOS transistors in place of PMOS transistors, PMOS transistors in place of NMOS transistors, bipolar junction transistors in place of metal oxide semiconductor field effect transistors, etc. A transistor has a control terminal and a pair of current terminals. The control terminal of a metal oxide semiconductor field effect transistor is the gate, and the current terminals are the drain and source. The control terminal of a bipolar junction transistor is the base, and the current terminals are the emitter and collector.

The source of transistor MN1 is coupled to ground. The drain of transistor MN1 is coupled to capacitor C1 and to the cathode of diode Q1. The drain and source of transistor MN1 are coupled to respective terminals of capacitor C1. The current source circuit I1 (which may comprise one or more transistors) is coupled between the supply voltage VDD and the anode of diode Q1. The operational amplifier 612 has a positive (non-inverting) input and a negative (inverting) input. The positive input of the operational amplifier 612 is coupled to the anode of diode Q1 and the current source circuit i1. The output of the operational amplifier 612 is coupled to the gate of transistor MN2. The source of transistor MN2 is coupled to the anode of diode Q2 and to the negative input of the operational amplifier 612.

The cathode of diode Q2 is coupled to the drain of transistor MN3. The source of transistor MN3 is coupled to ground, and the gate of transistor MN3 is biased at a voltage large enough to turn on transistor MN3 and cause it to be operated in saturation. In this example, the gate of transistor MN3 is coupled to VDD.

The drain of transistor MN2 is coupled to transistor MP1. The gates of transistors MP1 and MP2 are coupled together and to the drain of transistor MP1. The sources of transistors MP1 and MP2 are coupled to VDD. Any drain current that flows through transistor MP1 is mirrored through transistor MP2 as current Islope.

When the signal 601 on the gate of transistor MN1 is high (high enough to turn on MN1), any charge that was on capacitor C1 is discharged through transistor MN1 to ground. In this state (MN1 on), the current I1 from the current source circuit I1 flows through diode Q1 and through transistor MN1 to ground. The voltage across the capacitor C1 is designated as Vd1. While transistor MN1 is on, voltage Vd1 is approximately 0 V. The voltage, Vap, on the anode of diode Q1 (and thus the voltage provided to the positive input of the operational amplifier 610) is the on-voltage of the diode Q1 above Vd1 (e.g., approximately 1V). The negative input of the operational amplifier 612 has a voltage labeled "Van." In the steady state, Van equals Vap. As such, the voltage on the anode of diode Q2 (which is Van) is equal to the voltage on the anode of diode Q1 (Vap). The voltage of the output signal 613 from the operational amplifier 612 is equal to Van plus the gate-to-source voltage (Vgs) of transistor MN2. The output signal 613 is the gate signal to transistor MN2, and is high enough to turn on transistor MN2.

With transistor MN1 in the on-state, the voltage Vap is the on-voltage of diode Q1 above Vd1 (and Vd1 is approximately 0V). The drain current through transistor MP1 is I2, and current I2 is a function, at least in part, of the Vgs of transistor MN2. Current I2 is mirrored through transistor MP2. The current mirroring ratio of the current mirror 620 is 1:K2, where K2 is equal to 1 or a number other than 1. The mirrored current through transistor MP2 is Islope. Islope is relatively constant when transistor MN1 is on.

When the signal 601 on the gate of transistor MN1 is low (low enough so that transistor MN1 is off), current I1 flows through diode Q1 to the capacitor C1. As a result of receiving fixed current level I1, the voltage, Vd1, on capacitor C1 linearly ramps up as illustrated at 631. The voltage Vap also linearly ramps up (as illustrated at 632) but is at a level equal to the on-voltage of diode Q1 above Vd1. The voltage Van, which is equal to Vap, also ramps up as illustrated at 633. The voltage, Vd3, on the drain of transistor MN3 is at a fixed level due to transistor MN3 being biased on with a fixed gate voltage. Accordingly, the voltage across the diode Q2 linearly ramps up when transistor MN1 is off.

Figure 7:
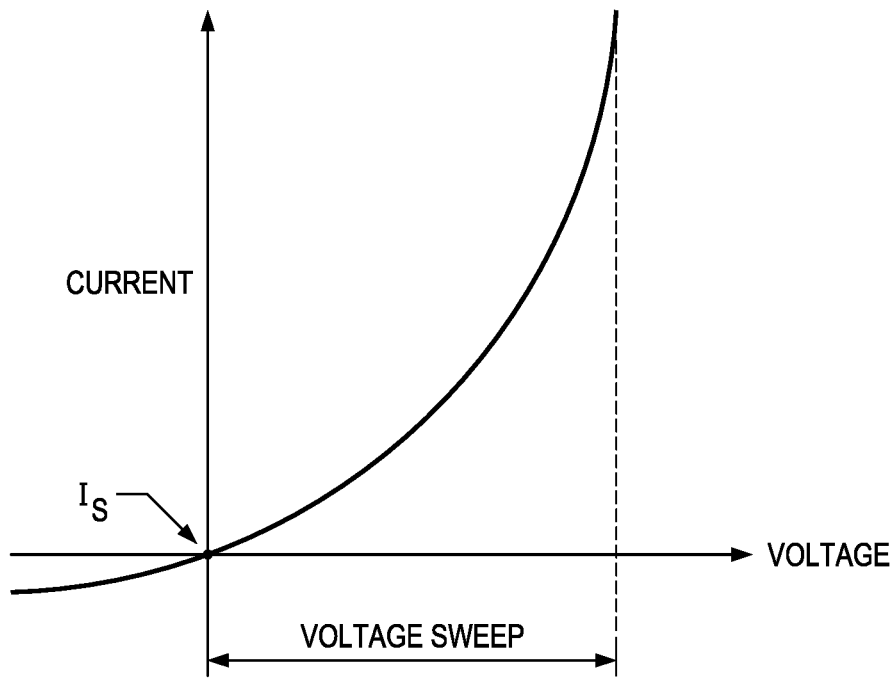
FIG. 7 shows the exponential relationship between current and voltage for a diode in accordance with an example.

FIG. 7 illustrates the current versus voltage relationship for a diode. Diode current is exponentially related to the voltage across the terminals of the diode. That is, as the voltage across the diode linearly increases with respect to time, the diode current exponentially increases with respect to time.

Figure 8:
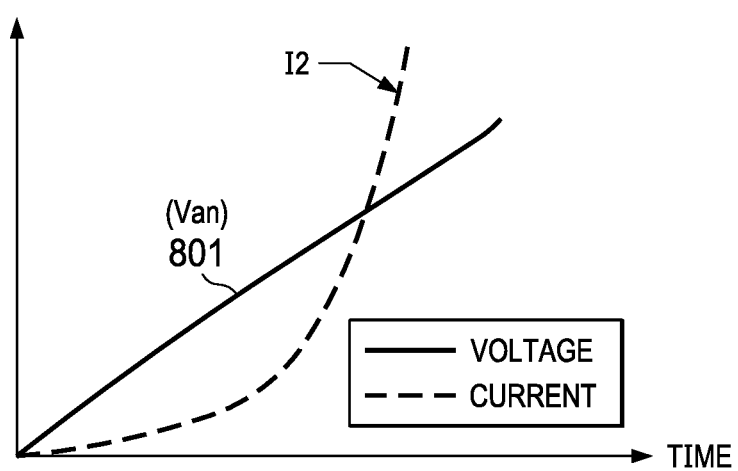
FIG. 8 shows that as voltage across a diode increases linearly with respect to time, its current increases exponentially with respect to time in accordance with an example.

Referring again to FIG. 6, as voltage Van linearly increases with respect to time, the current through diode Q2, I2, increases exponentially with respect to time, as illustrated 634. Due to the current mirroring function of current mirror 620, current Islope also increases exponentially with respect to time as shown at 635. Thus, and as shown in FIG. 8, the linearly increasing voltage Vd1 on capacitor C1 is replicated across diode Q2. By linearly increasing the voltage across diode Q2 (curve 801 in FIG. 8), the current I2 generated therethrough increases exponentially with respect time.

FIG. 6 shows a portion of an example signal 601 to be provided to the gate of transistor MN1. The period of the switching cycle is Tsw. During a first portion 602 of each switching cycle, the signal 601 is high and during a second portion 603 of each switching cycle, the signal 601 is low. As explained above, when the signal 601 is high, Islope is equal to K2*I1, and when the signal 601 is low, Islope increases exponentially. The amount of time that Islope is held low is designated as α*Tsw, where α is in the range of 0 to 1. The exponential change in Islope occurs at the end of the α*Tsw first portion of each switching cycle. By starting the exponential change in Islope at the end of α*Tsw, the added slope signal is further reduced for larger duty cycle applications, thereby providing increased headroom available compared to the case of a linear change in Islope (FIG. 4). In one example, a is in the range of 0.4 to 0.48, which helps to avoid sub-harmonic oscillation.

The slope generator circuit 120 generates an exponentially increasing current Islope, which is useful for valley mode current control as explained above with regard to FIG. 5B.

It is possible that the magnitude of ISlope could depend on temperature. The temperature dependence may occur, at least in part, the current through a diode decreases as temperature increases, and vice versa. Thus, the current I2 (and thus Islope) through diode Q2 may decrease with increases in temperature, and vice versa. In one embodiment, to cancel out the temperature dependence on ISlope, the current source circuit I1 in FIG. 6 may be implemented as a current source circuit whose output current has a temperature dependency that is Proportional To Absolute Temperature (PTAT). As temperature increases, I1 increases, and thus the slopes of Vd1 (shown at 631), Vap (shown at 632), and Van (shown at 633) will increase with increasing temperature. The voltage Van is the anode voltage of diode Q2 and thus with an increase in temperature, the voltage across diode Q2 which tends to maintain the diode current (I2) at a relatively temperature-independent level. Moreover, by implementing I1 as a PTAT current source circuit, the current I2 will have little if any temperature-dependence, and thus ISlope also will be temperature independent.

Figure 9:
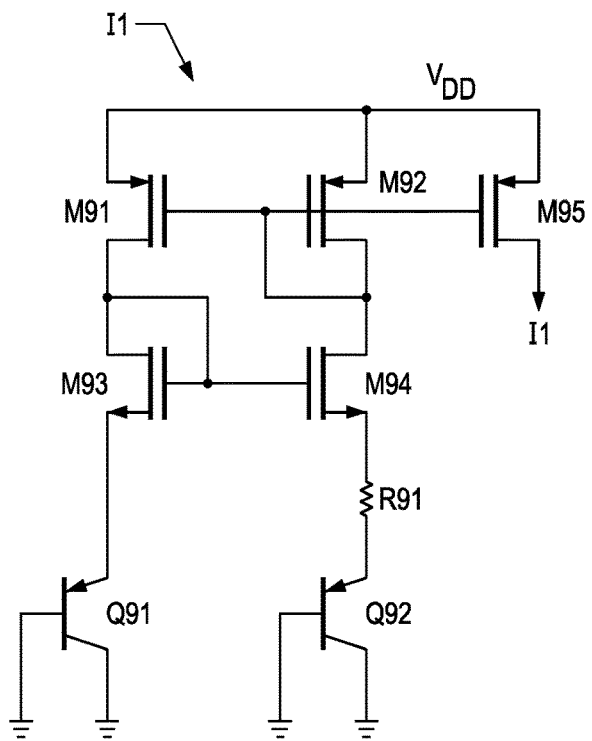
FIG. 9 shows a current source circuit which generates a current that is Proportional to Absolute Temperature (PTAT), in accordance with an example.

FIG. 9 shows an example of an implementation for the current source circuit I1. Current source circuit I1 in the example of FIG. 9 includes MOS transistors M91-M95, bipolar junction transistors Q91 and Q92 and a resistor R91. Transistors M91 and M92 are configured as a current mirror, as are transistors M93 and M94. Resistor R91 couples between the source of transistor M94 and transistor Q92, but no such resistor exists in the other leg (between transistors M93 and Q91. In this circuit, the output current, I1, is proportional to absolute temperature.

Figure 10:
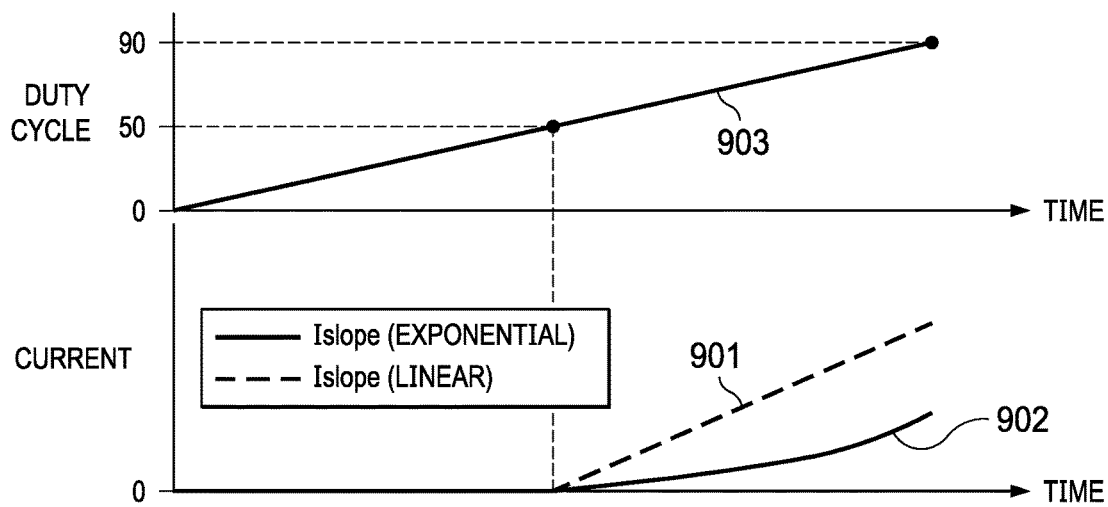
FIG. 10 illustrates that the slope of conventional slope compensation current is constant when the duty cycle is increased linearly with respect to time, but the slope of the exponential slope compensation current increases exponentially as the duty cycle increases linearly with respect to time.

FIG. 10 illustrates duty cycle (903) increasing linearly with respect to time. The figure illustrates ISlope as a linearly increasing current (901) and ISlope as an exponentially increasing current (902), both as a function of duty cycle (903).

Figure 11:
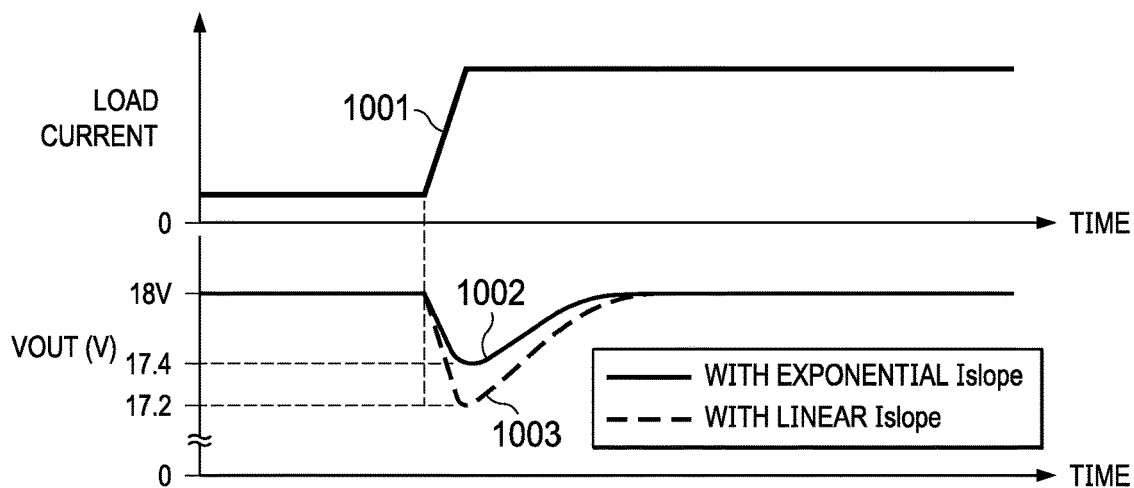
FIG. 11 shows that with exponential slope compensation, there is a smaller drop in output voltage from the converter from a sudden increase in load current than if linear slope compensation was used in accordance with an example.

FIG. 11 shows an example transient response of VOUT of the boost converter 100 from a sudden increase in load current (shown at 1001). VOUT is nominally 18V. Curve 1002 shows the temporary drop in, and then recovery of, VOUT with a linear implementation of ISlope. Curve 1003 shows the temporary drop in, and then recovery of, VOUT with an exponential implementation of ISlope. With an exponentially-changing ISlope (curve 1003), VOUT only falls to approximately 17.4V, whereas with a linearly-changing ISlope (curve 1002), VOUT falls farther to approximately 17.2V. Thus, with an exponentially-changing ISlope, a sudden increase in load current results in a smaller decrease in VOUT than for a linearly-changing ISlope.

Figure 12:
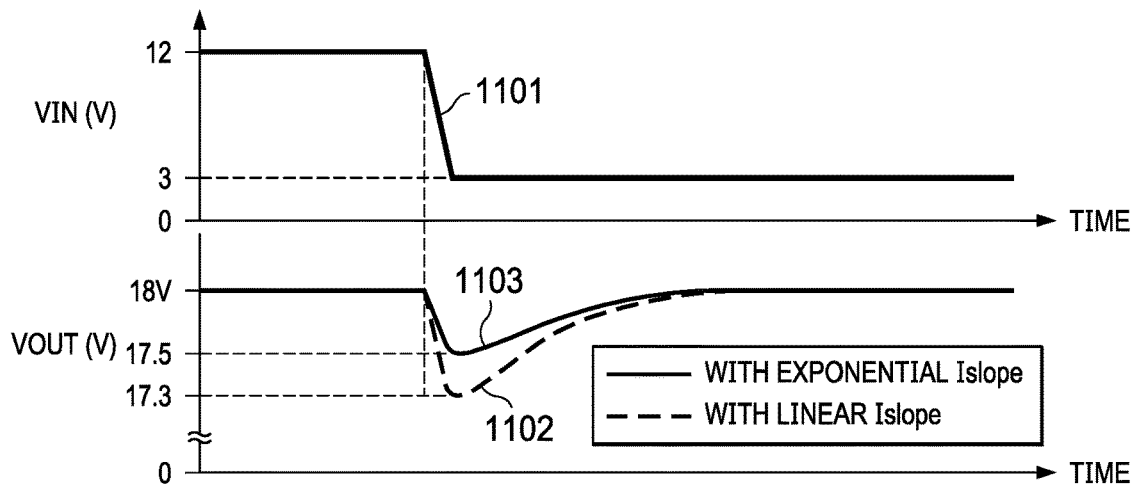
FIG. 12 shows that with exponential slope compensation, there is a smaller drop in output voltage from the converter from a sudden decrease in input voltage than if linear slope compensation was used in accordance with an example.

FIG. 12 shows an example transient response of VOUT of the boost converter 100 from a sudden decrease in VIN (shown at 1101). As in FIG. 11, VOUT in FIG. 12 is nominally 18V. Curve 1102 shows the temporary drop in, and then recovery of, VOUT with a linear implementation of ISlope. Curve 1103 shows the temporary drop in, and then recovery of, VOUT with an exponential implementation of ISlope. With an exponentially-changing ISlope (curve 1103), VOUT only falls to approximately 17.5V, whereas with a linearly-changing ISlope (curve 1102), VOUT falls farther to approximately 17.3V. Thus, with an exponentially-changing ISlope, a sudden decrease in VIN results in a smaller decrease in VOUT than for a linearly-changing ISlope.

Figure 13:
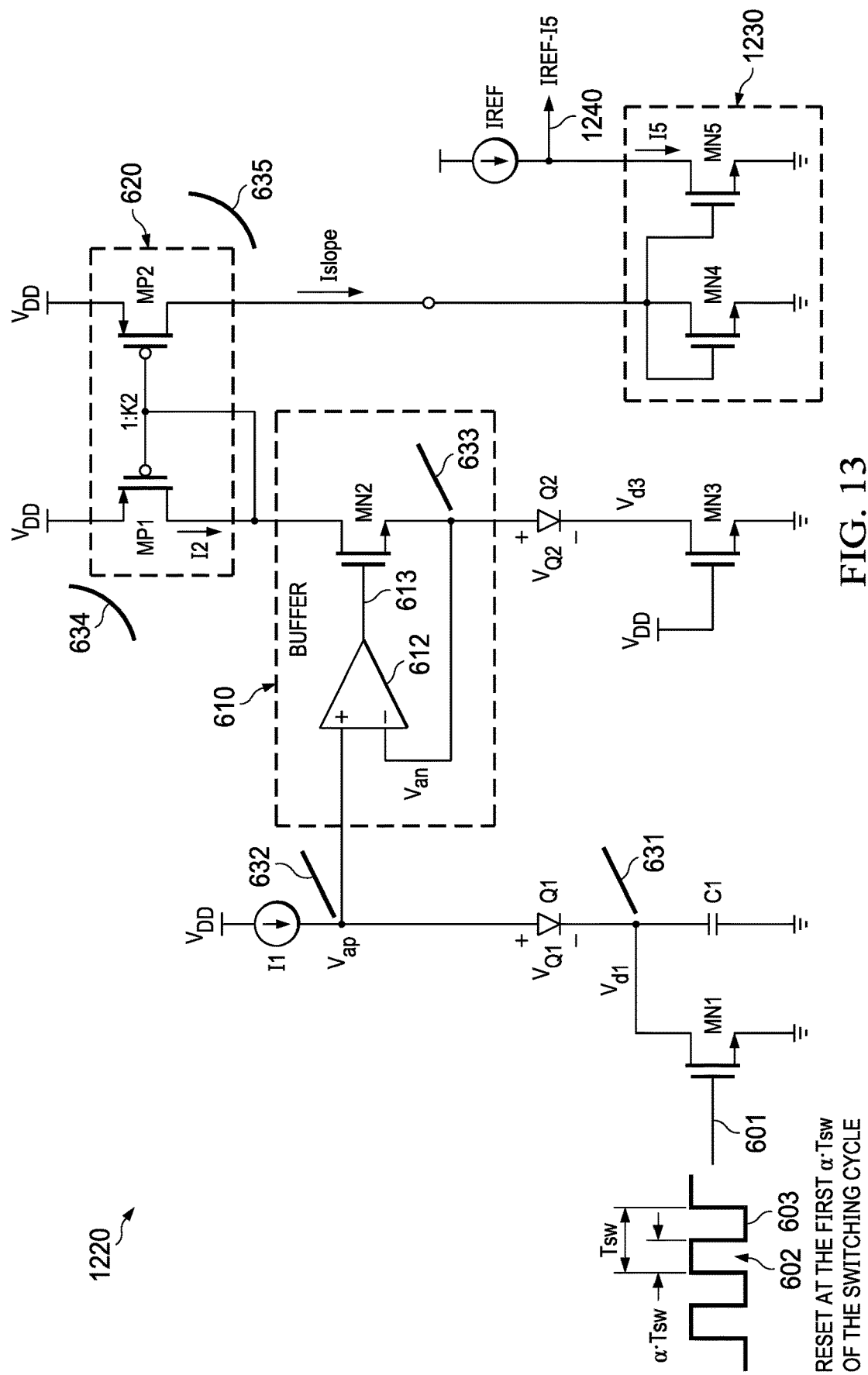
FIG. 13 illustrates an implementation of the slope compensation circuit of FIG. 1 in which exponential slope compensation is implemented for peak current mode control in accordance with an example.

The slope generator circuit 120 of FIG. 6 generates an exponentially increasing slope current, ISlope. An increasing slope current is useful for valley mode current control, such as that illustrated in FIG. 5B. For peak mode current control, such as that illustrated in FIG. 5A, the slope current should exponentially decrease during a portion of each switching cycle. FIG. 13 shows an example of a slope generator circuit 1220 that is mostly the same as the slope generator circuit 120 illustrated in FIG. 6. A difference in the slope generator circuit 1220 in FIG. 13 (with respect to the slope generator circuit 120 of FIG. 6) is the inclusion of a reference current source device, REF, and an extra current mirror 1230.

The current mirror 1230 includes NMOS transistors MN4 and MN5. The drain of transistor MN4 is coupled to the drain of MP2 and the current Islope that is generated through transistor MP2 also flows through transistor MN4. The current through transistor MN4 is mirrored through transistor MN5 and is shown as current I5 in FIG. 13. The magnitude of current I5 is proportional to the magnitude of current ISlope (e.g., assuming a 1:1 mirror ratio for current mirror 1230, I5 equals ISlope). The reference current source device IREF generates a fixed reference current (IREF) and the current through transistor MN5 is dictated by the magnitude of current I5. Any difference between REF and I5 is the current on conductor 1240. The current on conductor 1240 increases as I5 decreases, and the current on conductor 1240 decreases as I5 increases. Thus, as ISlope exponentially increases, the current on conductor 1240 exponentially decreases, and vice versa. The operation of slope generator circuit 1220 is largely the same as that explained above for slope generator circuit 120.

Figure 14:
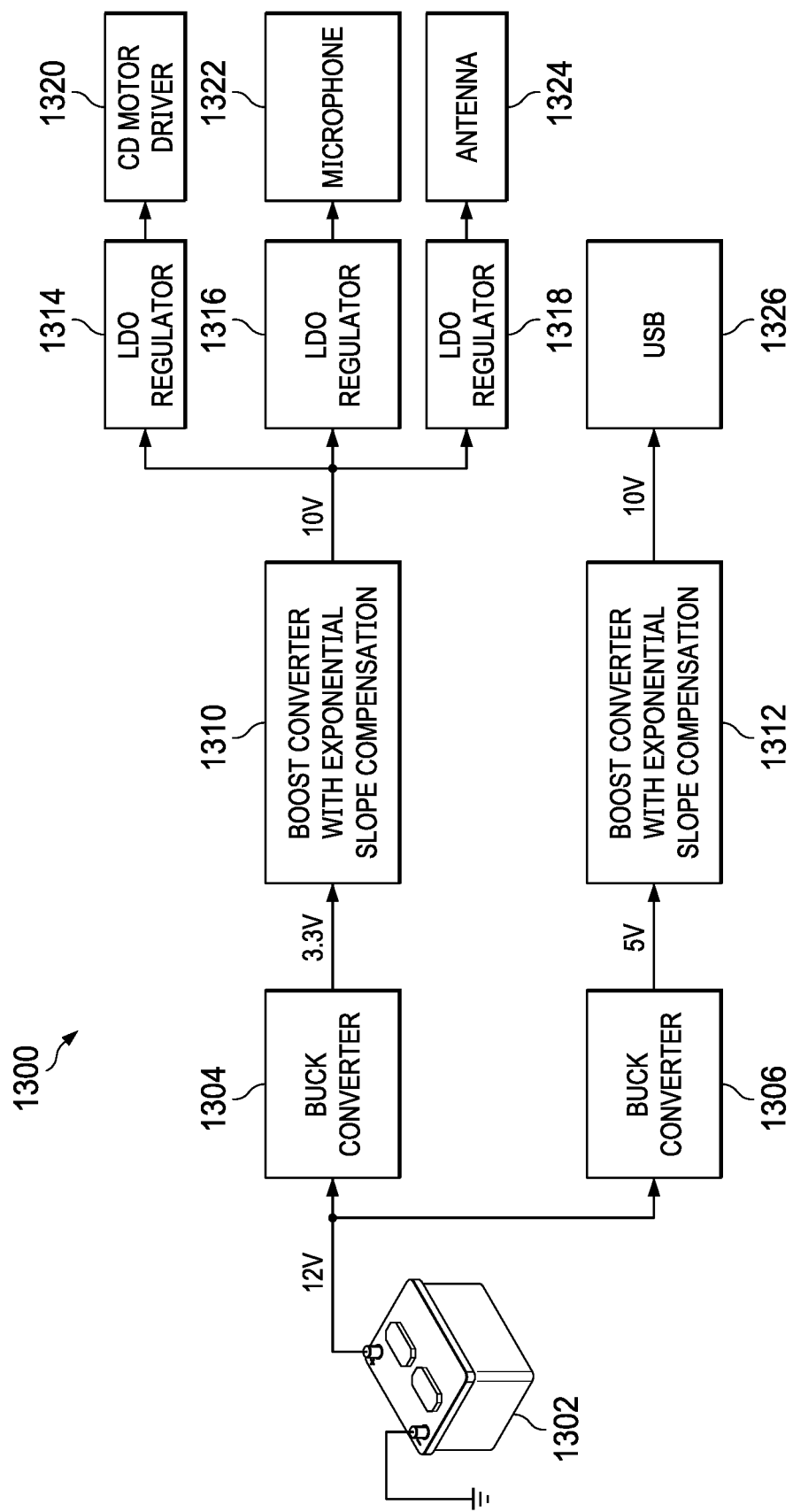
FIG. 14 shows a system that includes one or more switching converters that implement exponential slope compensation in accordance with an example.

FIG. 14 illustrates a system 1300 in which a switching voltage converter with exponential slope compensation is included. System 1300 is a portion of an automobile. The system 1300 includes the automobile's battery 1302, buck converters 1304 and 1306, boost converters with exponential slope compensation 1310 and 1312, low drop-out voltage regulators 1314, 1316, and 1318, a compact disc (CD) motor driver 1320, a microphone 1322, an antenna 1324, and a universal serial bus controller 1326. The buck converters 1304 and 1304 convert the voltage from the battery 1302 (e.g., 12 V) to a smaller voltage. For example, buck converter 1304 converts the battery's 12 V to 3.3V and buck converter 1306 converts the battery's 12 V to 5 V. Boost converter 1310 boosts the 3.3 V from buck converter 1304 to 10V. Similarly, boost converter 1312 boosts the 5 V from buck converter 1306 to 10V. LDO voltage regulators 1314, 1316, and 1318 produce suitable output voltages for driving their respective loads—the CD motor driver 1320, the microphone 1322, the antenna 1324, and the USB controller 1326.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:

1. A voltage converter, comprising:
an inductor,
a transistor having a control input and first and second transistor current terminals, the first current terminal coupled to the inductor;
a comparator having first and second comparator inputs and a comparator output, the comparator output configured to control the transistor;

an error amplifier having an error amplifier input and an error amplifier output, the error amplifier output coupled to the first comparator input; and a slope generator circuit having a slope generator output coupled to the second comparator input, the slope generator circuit configured to provide a slope compensation current at the slope generator output which, during at least a portion of each cycle of operation of the voltage regulator, varies exponentially with respect to time, the slope generator circuit including:

a current source circuit;

a capacitor coupled to the current source circuit;

a buffer having a buffer input and a buffer output, the buffer input coupled to the current source circuit; and a diode coupled to the buffer output.

2. The voltage converter of claim 1, further comprising a switch coupled across the capacitor.

3. The voltage converter of claim 1, wherein the diode is one of a diode or a diode-connected transistor.

4. The voltage converter of claim 1, wherein the current source circuit is a Proportional To Absolute Temperature (PTAT) current source circuit.

5. The voltage converter of claim 1, wherein:

the capacitor is configured to be charged by current from the current source circuit to thereby produce an approximately linearly increasing voltage across the capacitor;

the buffer is configured to respond to the linearly increasing voltage across the capacitor by generating an approximately linearly increasing voltage on the buffer output; and in response to the approximately linearly increasing voltage on the buffer output, the diode is configured to produce a diode current that increases approximately exponentially with respect to time.

6. The voltage converter of claim 5, further comprising a current mirror that is configured to receive the diode current and to mirror the diode current on an output of the current mirror as the slope compensation current.

7. The voltage converter of claim 6, wherein the current mirror is a first current mirror, and the voltage regulator includes a second current mirror coupled to the first current mirror.

8. The voltage converter of claim 1, wherein the voltage converter is one of a boost converter, a buck converter, a buck boost converter, or a single-ended primary-inductor converter.

9. A circuit, comprising:

a current source circuit;

a capacitor;

a first diode coupled between the current source circuit and the capacitor;

a buffer having a buffer input and a buffer output, the buffer input is coupled to the current source circuit; and a second diode coupled to the buffer output.

10. The circuit of claim 9, wherein the current source circuit is a Proportional To Absolute Temperature (PTAT) current source circuit.

11. The circuit of claim 9, including a current mirror coupled to the buffer, the current mirror having first and second transistors, wherein current through the first transistor is configured to flow through the second diode, and current through the second transistor changes approximately exponentially as a voltage across the second diode changes approximately linearly.

12. The circuit of claim 9, wherein the first diode is one of a diode or a diode-connected transistor, and the second diode is one of a diode or a diode-connected transistor.

13. The circuit of claim 9, wherein the current mirror is a first current mirror, and the circuit includes a second current mirror coupled to the first current mirror.

14. The circuit of claim 9, wherein the buffer includes:

an operational amplifier having a positive input, a negative input, and an output, the positive input is coupled to the first diode and the current source circuit; and a transistor having a control input and first and second current terminals, the control input is coupled to the output of the operational amplifier, and the second current terminal is coupled to the second diode and to the negative input of the buffer.

15. A circuit, comprising:

a current source circuit;

a capacitor;

a first diode coupled between the current source circuit and the capacitor;

a buffer having a buffer input and a buffer output, the buffer input is coupled to the current source circuit;

a second diode coupled to the buffer output; and a current mirror coupled to the buffer, the current mirror having first and second transistors, wherein current through the first transistor is configured to flow through the second diode, and current through the second transistor changes exponentially as a voltage across the second diode changes linearly.

16. The circuit of claim 15, wherein at least one of the first and second didoes is at least one of a diode or a diode-connected transistor.

17. The circuit of claim 15, wherein the current mirror is a first current mirror, and the circuit includes a second current mirror coupled to the first current mirror.

18. The circuit of claim 15, wherein the buffer includes:

an amplifier having a first input, a second input, and an output, the first input is coupled to the first diode and the current source circuit; and a transistor having a control input and first and second current terminals, the control input is coupled to the output of the operational amplifier, and the second current terminal is coupled to the second diode and to the second input of the buffer.

19. The circuit of claim 15, wherein the current source circuit is a Proportional To Absolute Temperature (PTAT) current source circuit.

* * * * *